United States Patent
Kerr et al.

(10) Patent No.: US 6,702,915 B2
(45) Date of Patent: Mar. 9, 2004

(54) LAMINATION ENVELOPE

(75) Inventors: Roger S. Kerr, Brockport, NY (US); Larry R. Gartz, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 136 days.

(21) Appl. No.: 10/014,115

(22) Filed: Oct. 26, 2001

(65) Prior Publication Data

US 2003/0079827 A1 May 1, 2003

(51) Int. Cl.[7] .......................... B44C 1/16; B32B 31/04; B32B 31/20; B32B 4/00; G03C 11/00
(52) U.S. Cl. .................. 156/230; 156/247; 156/289; 450/199; 450/257; 428/195; 428/411.1; 428/94; 250/318; 250/319
(58) Field of Search ............................... 156/230, 239, 156/240, 241, 247, 277.2, 289; 427/146, 147, 148, 162; 430/199, 200, 256, 257; 428/40.1, 195, 200, 202, 207, 914, 411.1, 457; 250/318, 319; 219/216; 283/75, 82, 107, 109

(56) References Cited

U.S. PATENT DOCUMENTS

| | | | |
|---|---|---|---|
| 4,659,927 A | * | 4/1987 | Tago et al. .................. 250/318 |
| 5,203,942 A | | 4/1993 | DeCook et al. |
| 5,268,708 A | | 12/1993 | Harshbarger et al. |
| 5,397,677 A | * | 3/1995 | Schuerwegen et al. ...... 156/230 |
| 5,476,568 A | * | 12/1995 | Marion et al. ............... 156/359 |
| 5,478,434 A | | 12/1995 | Kerr et al. |
| 5,563,234 A | * | 10/1996 | Otto ........................... 428/192 |
| 5,730,833 A | * | 3/1998 | Hatakeyama et al. ........ 156/540 |
| 6,471,810 B2 | * | 10/2002 | Sawano ....................... 156/230 |

FOREIGN PATENT DOCUMENTS

EP 859281 * 8/1998 ............. G03F/3/10

OTHER PUBLICATIONS

Kerr, "Laminator Assembly Having a Pressure Roller with a Deformable Layer" USSN 09/676,877, (Attorney Docket No. 78274), filed Sep. 29, 2000.

* cited by examiner

Primary Examiner—J. A. Lorengo
(74) Attorney, Agent, or Firm—Buskop Law Group, P.C.

(57) ABSTRACT

The present invention involves a method for forming an improved lamination envelope (260) for use in forming a pre-press proof (200) which comprises laminating at least one surface of a lamination envelope (150) with a pre-laminate sheet (240) comprising a first thermoplastic layer (300) and a first support layer (145) having a first release layer (270) and first support base (310), forming a lamination sandwich (210). The first support layer (145) from the lamination sandwich (210) is removed forming a pre-lamination envelope (250). A stiffener sheet (170) is laminated to the pre-lamination envelope (250) forming an improved lamination envelope (260).

30 Claims, 5 Drawing Sheets

LAMINATION ENVELOPE

FIELD OF THE INVENTION

The present invention relates to the art of color proofing, and in particular, to an improved lamination envelope used in the method of preparing a pre-press proof, such as by the use of pressure and heat to laminate media together.

BACKGROUND OF THE INVENTION

Pre-press proofing is a procedure that is used primarily by the printing industry for creating representative images of printed material. In the printing industry pre-press color proofs are used to check for color balance, control parameters and other important image quality requirements, without the cost and time that is required to actually produce printing plates, set up a printing press and produce an example of a representative image, which would result in higher costs and a loss of profits that would ultimately be passed on to the customer.

To create a pre-press proof first an original image is separated into individual color separations or digital files. The original image is scanned and separated into the three subtractive primaries and black. Typically a color scanner is used to create the color separations or digital files and in some instances, more than four color separations or digital files are used. Although there are several ways used in the printing industry to create a pre-press proof from the color separations or digital files they are generally one of three types. The first method being a color overlay system that employs the representative image on a separate base for each color, which are then overlaid to create a pre-press proof. The second, a single integral sheet process in which the separate colors for the representative image is transferred one at a time by lamination onto a single base. Third, a digital method in which the representative image is produced directly onto a receiver stock, or onto an intermediate sheet then transferred by lamination onto a receiver stock from digital files.

The representative image to be laminated can be created on, but is not limited to, a commercially available Kodak image processing apparatus, depicted in commonly assigned U.S. Pat. No. 5,268,708, which describes an image processing apparatus having half-tone color imaging capabilities. The above-mentioned image processing apparatus is arranged to form a representative image onto a sheet of thermal print media in which colorant from a sheet of colorant donor material is transferred to the thermal print media, by applying a sufficient amount of thermal energy to the colorant donor sheet material to form the representative image. The image processing apparatus is comprised generally of a material supply assembly, a lathe bed scanning subsystem. The scanning subsystem includes: a lathe bed scanning frame, translation drive, translation stage member, printhead, imaging drum, and media exit transports.

The operation of the image processing apparatus comprises of metering a length of the thermal print media (in roll form) from the material supply assembly. The thermal print media is then measured and cut into sheet form of the required length and transported to the imaging drum, registered, wrapped around, and secured onto the imaging drum. Next, a length of colorant donor material (in roll form) is also metered out of the material supply assembly, then measured and cut into sheet form of the required length. It is then transported to the imaging drum and wrapped around the imaging drum utilizing a load roller which is described in detail, in commonly assigned U.S. Pat. No. 5,268,708, such that it is superposed in the desired registration with respect to the thermal print media (which has already been secured to the imaging drum).

After the colorant donor sheet material is secured to the periphery of the imaging drum the scanning subsystem or write engine provides the imaging function. This image function is accomplished by retaining the thermal print media and the colorant donor sheet material on the imaging drum while it is rotated past the printhead. The translation drive traverses the printhead and translation stage member axially along the axis of the imaging drum, in coordinated motion with the rotating imaging drum. These movements combine to produce the representative image on the thermal print media.

Once the representative image has been formed on the thermal print media, the colorant donor sheet material is then removed from the imaging drum. This is accomplished without disturbing the thermal print media that is beneath it. The colorant donor sheet material is then transported out of the image processing apparatus by means of the material exit transport. Additional colorant donor sheet materials featuring other desired colorants are sequentially superimposed with the thermal print media on the imaging drum and then imaged onto the thermal print media as previously mentioned, until the representative image is completed on the thermal print media. The representative image formed thereon is then unloaded from the imaging drum and transported by the receiver sheet material exit transport to an exit tray in the exterior of the image processing apparatus.

After a representative image has been formed on the thermal print media as previously described it is transferred to a receiver stock such that the pre-press proof is representative of an image intended to be printed on a printing press. A Kodak laminator as described in U.S. Pat. No. 5,478,434 can be used to bond or laminate the representative image as a part of a pre-press proofing system. As additional references U.S. Pat. No. 5,203,942 describes a Kodak laminator that employs a lamination/de-lamination system as applied to a drum laminator and pending U.S. patent application Ser. No. 09/676,877, filed Sep. 29, 2000, describes a Kodak laminator that employs endless belts incorporated into the lamination apparatus. For the purpose of this patent application the laminator described in U.S. patent application Ser. No. 09/676,877 will be used. It should be noted that the present invention described in this disclosure is not limited to a Kodak laminator or type of laminator referenced above.

The receiver stock can be sheet-fed press printing stock, specially coated paper stock, or previously laminated stock. In this latter case a sheet of pre-laminate, which has a pre-laminate support layer consisting of a suitable base material, optionally coated with a releasing material, and a thermal print layer, is placed on top of a receiver sheet, which is also called receiver stock in the industry. This construction of multiple layers is a lamination sandwich, which is fed into the laminator. Once the lamination sandwich exits the laminator the pre-laminate support layer is peeled away from the now pre-laminated receiver stock. Any of the laminators referred to above can be used to affect the transfer of the pre-laminate receiving layer to the receiver stock.

Although the above described lamination method works well for most materials and for both laser thermal and inkjet pre-press proofs. There exists a need for improving the life of the lamination envelope and the quality of the laminated pre-press proof such as minimizing image ripple and also expanding the variety of materials, which the thermal print media will laminate to.

SUMMARY OF THE INVENTION

The present invention involves a method for forming an improved lamination envelope for use in forming a pre-press proof which comprises laminating at least one surface of a lamination envelope with a pre-laminate sheet comprising a first thermoplastic layer and a first support layer having a first release layer and first support base, forming a lamination sandwich. The first support layer from the lamination sandwich is removed forming a pre-lamination envelope. A stiffener sheet is laminated to the pre-lamination envelope forming an improved lamination envelope.

In another embodiment of the invention a method for using an improved lamination envelope for forming a pre-press proof comprises creating an imaged receiver sheet with an image formed by an inkjet printer, laser printer, or any other printing method known in the art. A second thermoplastic layer and a second support layer having a second release layer, aluminized layer and a second support base is created. The imaged receiver sheet and a receiver stock is inserted into said improved lamination envelope forming an image lamination packet. The image lamination packet is passed through a laminator, forming an imaged lamination sandwich within the image lamination packet. The imaged lamination sandwich is then removed from the improved lamination envelope and the second support layer is removed from the imaged lamination sandwich forming a pre-press proof.

In yet another embodiment of the invention a method for using an improved lamination envelope for forming a pre-press proof comprises inserting a receiver stock and a pre-laminate sheet comprising a first thermoplastic layer and a first support layer having a first release layer and first support base into an improved lamination envelope forming a pre-lamination lamination packet. The pre-lamination lamination packet is passed through a laminator forming a pre-lamination sandwich within the lamination packet. The pre-lamination sandwich is removed from the improved lamination envelope. The first support layer is removed forming a pre-laminated receiver stock. Creating an imaged receiver sheet with an image formed by an inkjet printer, laser printer, or any other printing method known in the art is created. A second thermoplastic layer and a second support layer having a second release layer, aluminized layer and a second support base are inserted. The imaged receiver sheet and a pre-laminated receiver stock are inserted into the improved lamination envelope forming an image lamination packet. The image lamination packet passes through a laminator, forming an imaged lamination sandwich within the image lamination packet. The imaged lamination sandwich is then removed from the improved lamination envelope and the second support layer is removed from the imaged lamination sandwich forming a pre-press proof.

The above described methods can be used to form a pre-press proof with a resolution of between about 1000 and 4000 dpi, although in the most preferred embodiment, the resolution is between 1200 and 3600 dpi.

The method forming an improved lamination envelope for laminating a pre-press proof can be modified so that the first support layer 145 consists of a support base, a second release layer, or just support base.

In still another embodiment of present invention the stiffener sheet can be made from a metal, a plastic sheet or a plurality of plastic sheets, card stock or combinations there of. In the most preferred embodiment, the material is a plastic.

In yet another embodiment of the present invention the second support layer can consist of only two layers, a support base and a release layer or just support base.

In yet another embodiment of the present invention only stiffener sheet be laminated to a lamination envelope to form an improved lamination envelope.

It is contemplated that the first thermoplastic layer and the second thermoplastic layer used in this invention has a thickness between 1 and 75 microns. It is also contemplated that the method of making the improved lamination envelope can be with a belted laminator.

It is within the scope of the invention that the image on the imaged receiver sheet can be either a monochrome image or a multi colored image. It is also contemplated to be within the scope of the invention to use an imaged receiver sheet, which uses an image generated by an inkjet printing method.

DETAILED DESCRIPTION OF THE INVENTION

The present invention will be directed, in particular, to elements forming part of, or cooperating more directly with an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus used in the forming: of a pre-press proofs.

Figure 1:
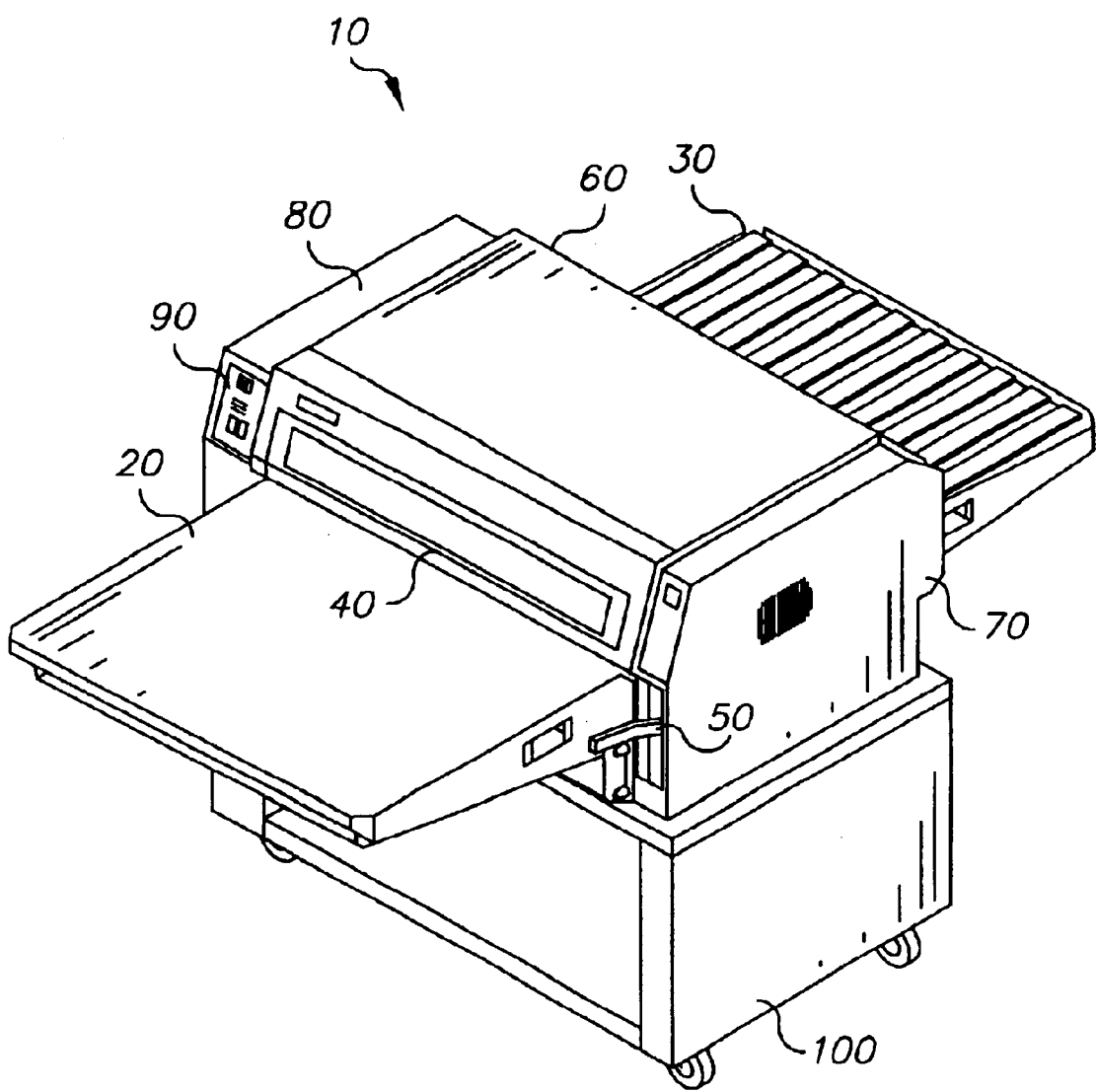
FIG. 1 is a perspective view showing a laminator known in the related are used with the present invention.

Referring to the drawings wherein like reference numerals represent identical or corresponding parts throughout the several views. Referring to FIG. 1, there is shown perspective view of laminator 10 as described in U.S. patent application Ser. No. 09/676,877. The laminator has an entrance table 20, exit table 30, entrance slot 40, pressure lever 50, top cover 60, right side cover 70, left side cover 80, control panel 90, and lamination base 100.

Figure 2:
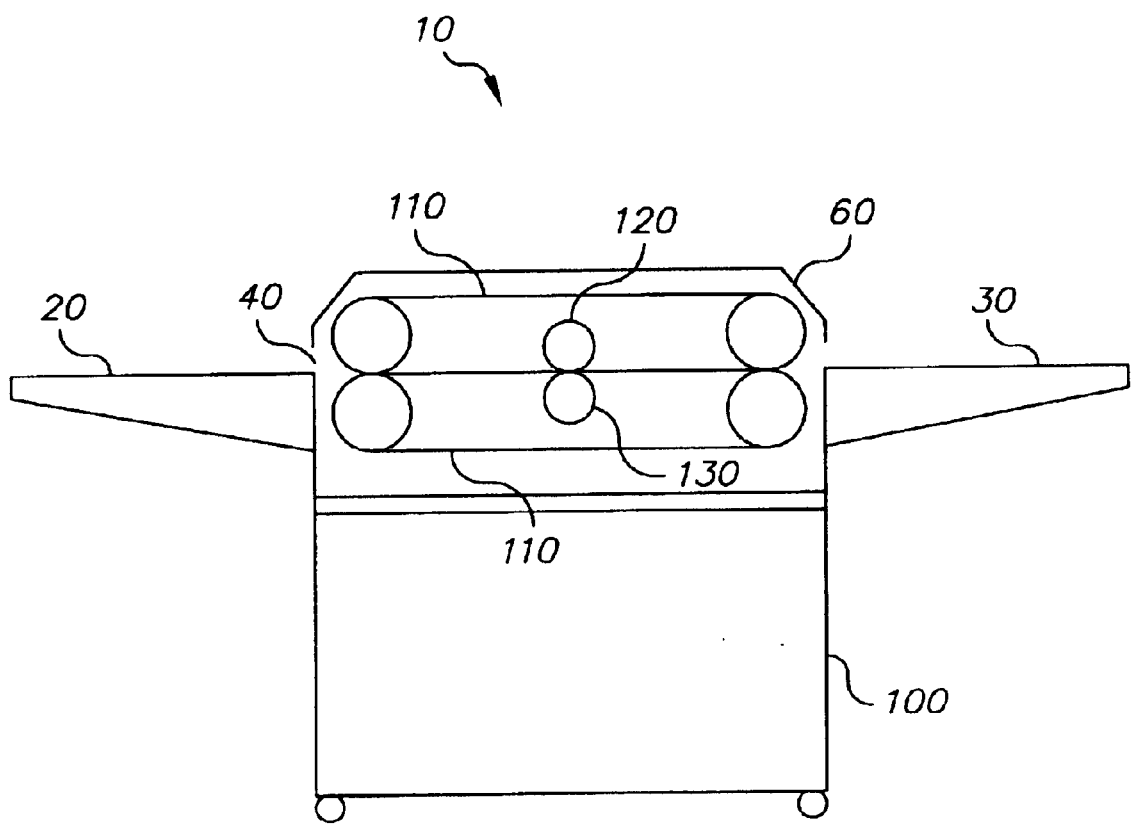
FIG. 2 is a schematic right side elevation of the laminator of FIG. 1.

FIG. 2 is a schematic right side elevation of the laminator of FIG. 1 showing endless belts 110 with upper lamination roller 120 and lower lamination roller 130 which convey the media to be laminated through the laminator 10. Media to be bonded or laminated passes between the endless belts 110. Upper lamination roller 120 and lower lamination roller 130 provide heat and pressure to laminate the desired media together. This configuration with upper lamination roller 120 and lower lamination roller 130 is called a "straight-through" laminator. Although the illustrated embodiments show both the upper lamination roller 120 and lower lamination roller 130 as heated pressure rollers, it also should be recognized that only one of the upper lamination roller 120 and lower lamination roller 130 may be heated. It is further recognized that both upper lamination roller 120 and lower lamination roller 130 do not have to be heated for cold lamination applications.

Figure 3:
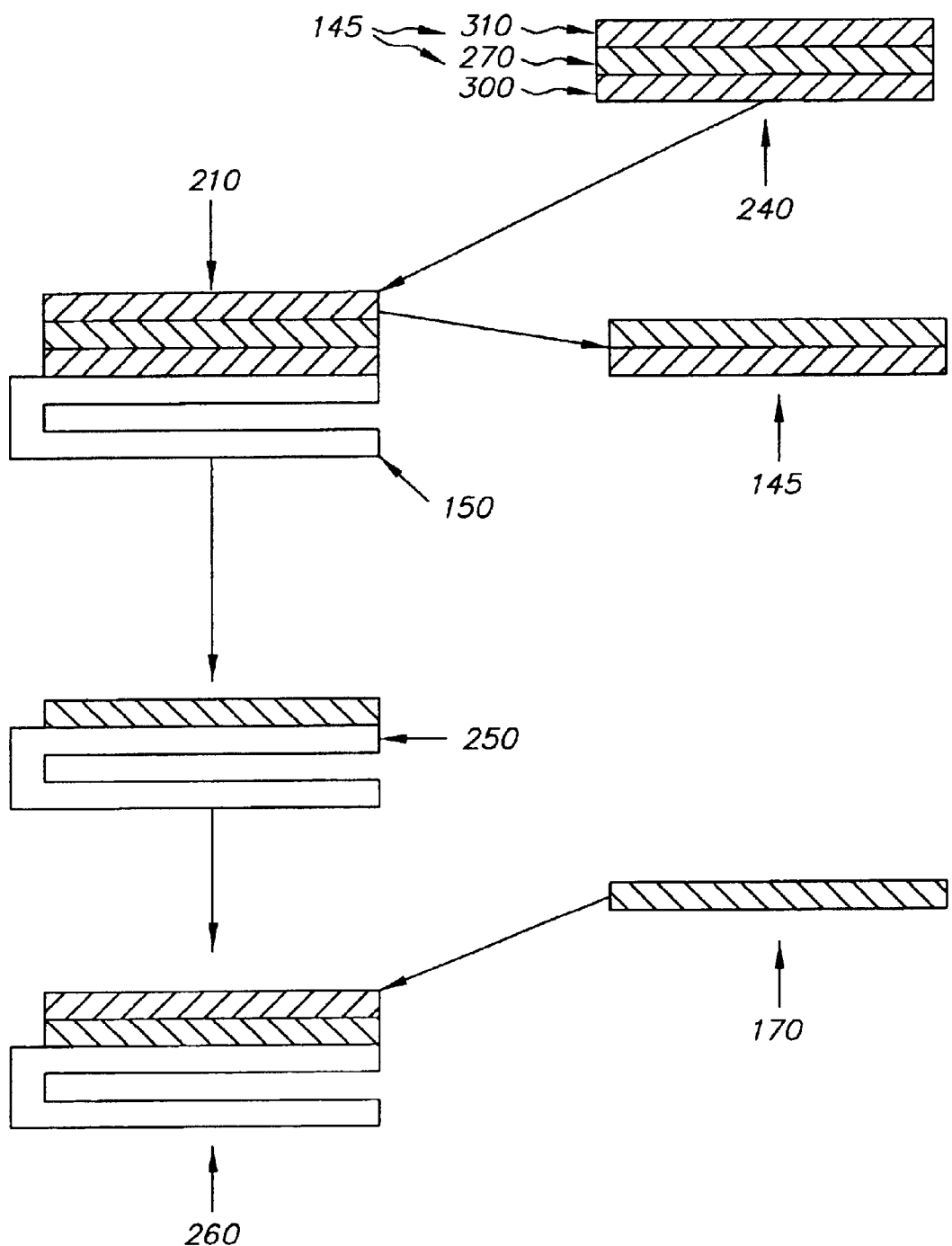
FIG. 3 is a block diagram showing one embodiment of the method for producing an improved lamination envelope.

As shown in FIG. 3, the invention relates to a method for forming an improved lamination envelope 260 for use in forming a pre-press proof 200. The method of fabrication of an improved lamination envelope 260 comprises laminating at least one surface of a lamination envelope 150 with a pre-laminate sheet 240 comprising a first thermoplastic layer 300 and a first support layer 145 having a first release layer 270 and first support base 310, forming a lamination sandwich 210. The first support layer 145 is removed from the lamination sandwich 210 forming a pre-lamination envelope 250. A stiffener sheet 170 is laminated to the pre-lamination envelope 250 forming an improved lamination envelope 260.

Figure 4:
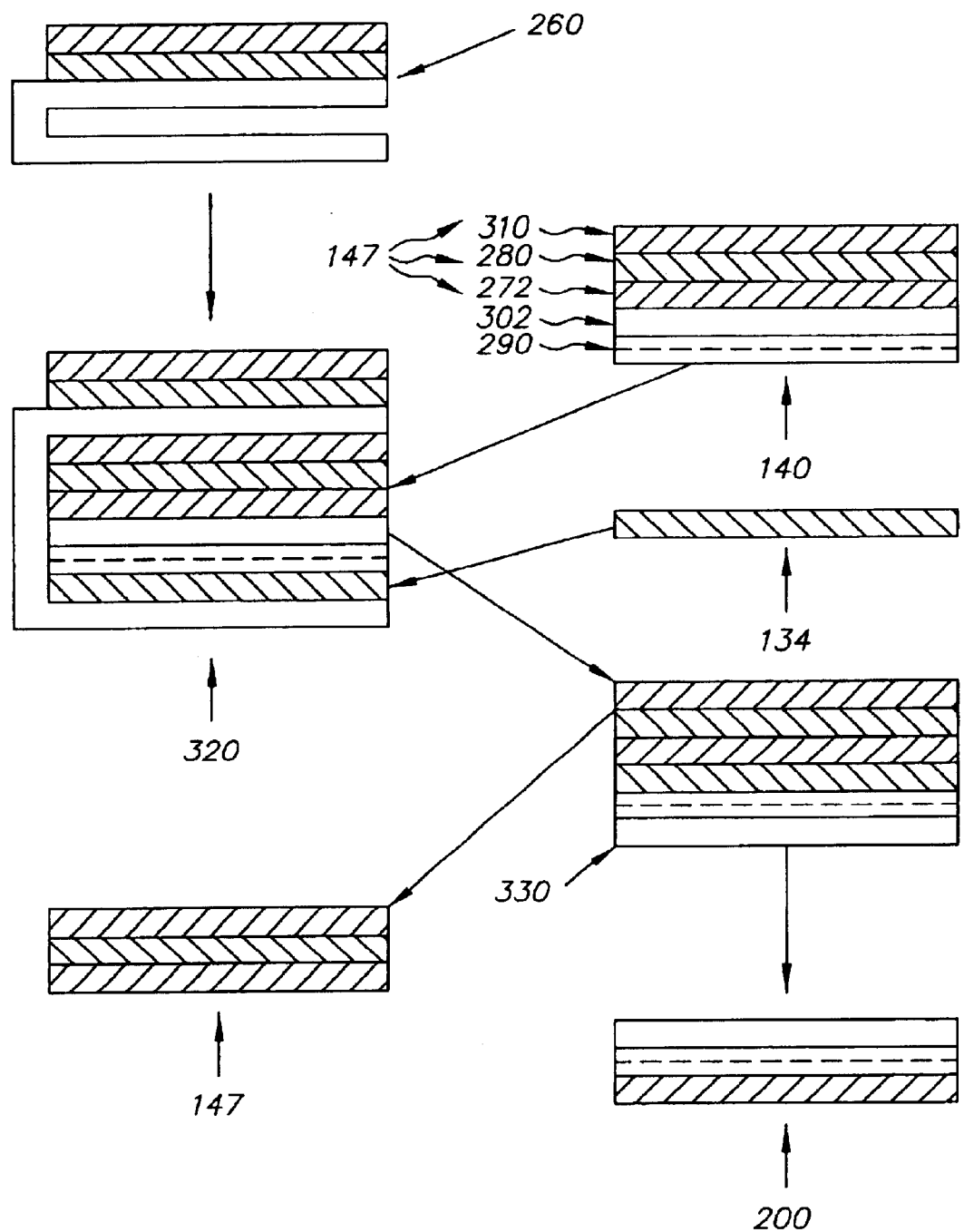
FIG. 4 is a block diagram showing one embodiment of the method for producing a pre-press proof using the improved lamination envelope.

As shown in FIG. 4, the invention relates to a method for using an improved lamination envelope 260 for forming a pre-press proof 200 which comprises creating an imaged receiver sheet 140 with an image 290 formed by an inkjet printer, laser printer, or any other printing method known in the art, a second thermoplastic layer 302 and a second support layer 147 having a second release layer 272, aluminized layer 280 and a second support base 312. The imaged receiver sheet 140 and a receiver stock 134 is inserted into the improved lamination envelope 260 forming an image lamination packet 320. The image lamination packet 320 is passed through a laminator, forming an imaged lamination sandwich 330 within the image lamination packet 320. The imaged lamination sandwich 330 is then removed from the improved lamination envelope 260 and the second support layer 147 is removed from the imaged lamination sandwich 330 forming a pre-press proof 200.

Figure 5:
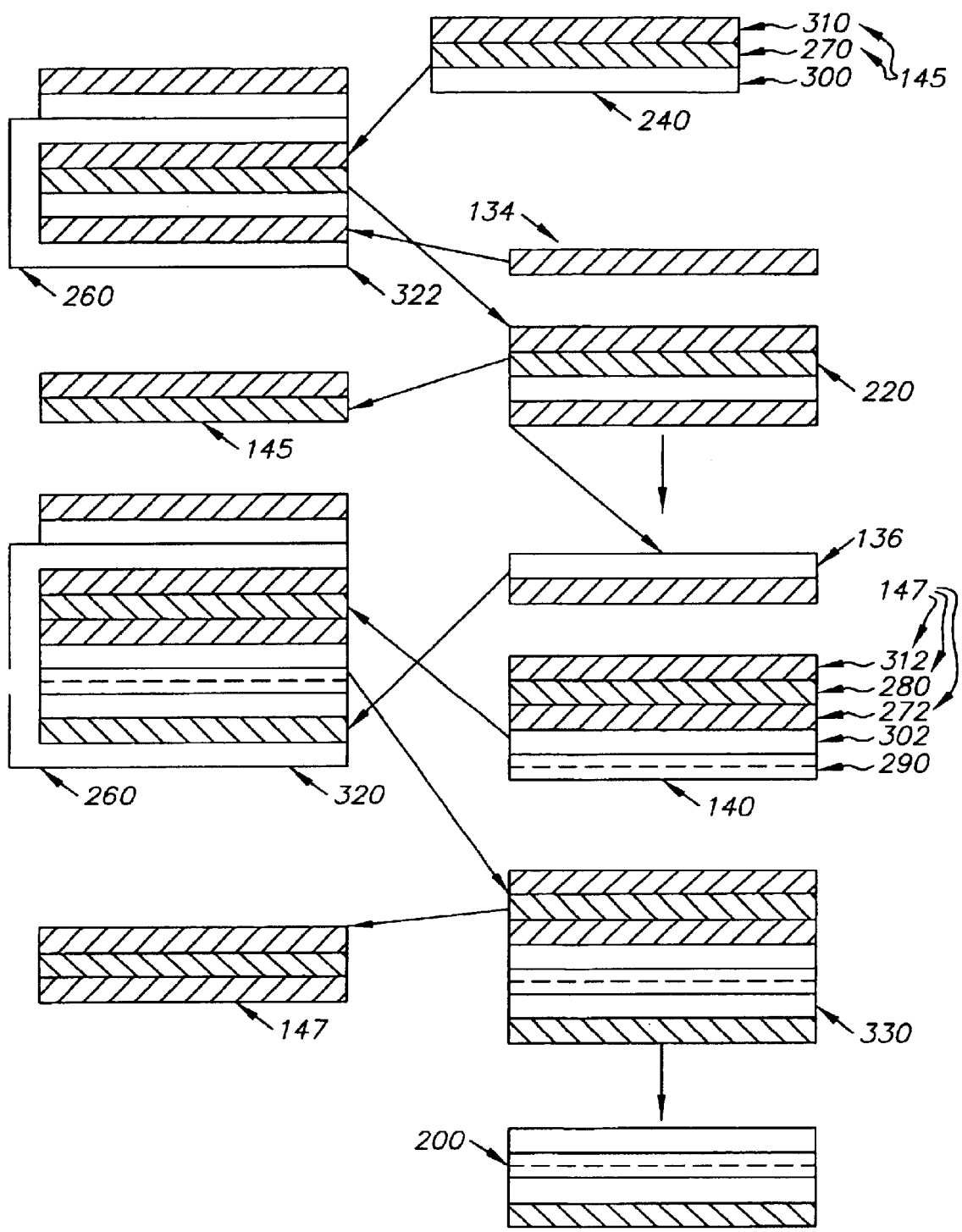
FIG. 5 is a block diagram showing one embodiment of the method for producing a pre-press proof using the improved lamination envelope.

As shown in FIG. 5, the invention relates to a method for using an improved lamination envelope 260 for forming a pre-press proof 200 which comprises inserting a receiver stock 134 and a pre-laminate sheet 240 comprising a first thermoplastic layer 300 and a first support layer 145 having a first release layer 270 and first support base 310 into an improved lamination envelope 260 forming a pre-lamination lamination packet 322. The pre-lamination lamination packet 322 is passed through a laminator forming a pre-lamination sandwich 220 within the lamination packet 320. The pre-lamination sandwich 220 is removed from the improved lamination envelope 260, removing the first support layer 145 forming a pre-laminated receiver stock 136. An imaged receiver sheet 140 with an image 290 formed by an inkjet printer, laser printer, or any other printing method known in the art is created. A second thermoplastic layer 302 and a second support layer 147 having a second release layer 272, aluminized layer 280 and a second support base 312 is also created. The imaged receiver sheet 140 and a pre-laminated receiver stock 136 is inserted into the improved lamination envelope 260 forming an image lamination packet 320. The image lamination packet 320 is passed through a laminator, forming an imaged lamination sandwich 330 within image lamination packet 320. The imaged lamination sandwich 330 is then removed from the improved lamination envelope 260 and the second support layer 147 is removed from the imaged lamination sandwich 330 forming a pre-press proof 200.

The above described methods can be used to forming a pre-press proof 200 with a resolution of between about 1000 and 4000 dpi, although in the most preferred embodiment, the resolution is between 1200 and 3600 dpi.

The method forming an improved lamination envelope 260 for laminating a pre-press proof can be modified so that the first support layer 145 consists of a support base 310, a second release layer 270, or just support base 310

In still another embodiment of the method for forming an improved lamination envelope 260 for laminating a pre-press proof 200, the stiffener sheet 170 can be made from a metal, a plastic sheet or a plurality of plastic sheets, card stock or combinations there of. In the most preferred embodiment, the material is a plastic.

In yet another embodiment of the method for forming an improved lamination envelope 260 for laminating a pre-press proof 200, the second support layer can consist of only two layers, a support base 310 and a release layer 270 or just support base 310.

In yet another embodiment of the method for forming an improved lamination envelope 260 for laminating a pre-press proof 200, that only stiffener sheet 170 be laminated to a lamination envelope 150 to form an improved lamination envelope 260.

It is contemplated that first thermoplastic layer 300 and second thermoplastic layer 302 used in this invention has a thickness between 1 and 75 microns. It is also contemplated that the method of making the improved lamination envelope 260 can be with a belted laminator.

It is within the scope of the invention that the image 290 on the imaged receiver sheet 140 can be either a monochrome image or a multi colored image. It is also contemplated to be within the scope of the invention to use an imaged receiver sheet 140, which uses an image 290 generated by an inkjet printing method.

The invention has been described in detail with particular reference to certain preferred embodiments thereof, but it will be understood that variations and modifications can be effected within the scope of the invention.

Parts List

10. Laminator
20. Entrance table
30. Exit table
40. Entrance slot
50. Pressure lever
60. Top cover
70. Right side cover
80. Left side cover
90. Control panel
100. Lamination base
110. Endless belts
120. Upper lamination roller
130. Lower lamination roller
134. Receiver stock
136. Pre-lamination receiver stock
140. Imaged receiver sheet
145. First support layer
147. Second support layer
150. Lamination envelope
170. Stiffener sheet
200. Pre-press proof
210. Lamination sandwich
220. Pre-lamination sandwich
240. Pre-laminate sheet
250. Pre-lamination envelope
260. Improved lamination envelope
270. First release layer
272. Second release layer
280. Aluminized layer
290. Image 300. First thermoplastic layer
302. Second thermoplastic layer
310. First support base
312. Second support base
320. Image lamination packet
322. Pre-lamination packet
330. Imaged lamination sandwich

What is claimed is:

1. A method for forming an improved lamination envelope for laminating a pre-press proof comprising:
   laminating at least one surface of a lamination envelope with a pre-laminate sheet comprising a thermoplastic layer and a support layer with a release layer and a support base, forming a lamination sandwich;
   removing the support layer from the lamination sandwich forming a pre-lamination envelope; and
   laminating a stiffener sheet to said pre-lamination envelope forming an improved lamination envelope.

2. The method of claim 1, wherein said support layer consists of a support base.

3. The method of claim 1, wherein said stiffener sheet comprises a member of the group, metal, plastic sheets, card stock and combinations thereof.

4. The method of claim 1 wherein said support layer consists of a support base and a second release layer.

5. The method of claim 1 wherein said thermoplastic layer has a thickness between 1 and 75 microns.

6. The method of claim 1, wherein said laminating is performed with a belted laminator.

7. A method for using an improved lamination envelope for forming a pre-press proof comprising:
   laminating at least one surface of a lamination envelope with a pre-laminate sheet comprising a thermoplastic layer and a support layer with a release layer and a support base, forming a lamination sandwich;
   removing the support layer forming a pre-lamination envelope;
   laminating a stiffener sheet to said pre-lamination envelope forming an improved lamination envelope;
   creating a pre-laminated receiver stock
   creating an imaged receiver sheet with a second support layer;
   inserting the imaged receiver sheet and a pre-laminated receiver stock into the improved lamination envelope forming a lamination packet;
   laminating the lamination packet forming an imaged lamination sandwich;
   removing the imaged lamination sandwich from the improved lamination envelope; and
   removing said second support layer from the imaged lamination sandwich forming a pre-press proof.

8. The method of claim 7, wherein said stiffener sheet comprises a member of the group, metal, plastic sheets, card stock and combinations thereof.

9. The method of claim 7, wherein said imaged receiver sheet is a pre-press proof.

10. The method of claim 7 wherein said first support layer consists of a support base and a release layer.

11. The method of claim 7 wherein said second support layer consists of a support base, a release layer, and an aluminized layer.

12. The method of claim 7, wherein said thermoplastic layer has a thickness between 1 and 75 microns.

13. The method of claim 7, wherein said imaged receiver sheet comprises a monochrome image.

14. The method of claim 7, wherein said imaged receiver sheet comprises a multi colored image.

15. The method of claim 7, where in the imaged receiver sheet comprises an image is an inkjet generated image.

16. The method of claim 7, wherein said laminating is performed with a belted laminator.

17. A pre-press proof with a resolution of between 1000 dpi and 4000 dpi formed by the method of claim 7.

18. A pre-press proof with a resolution of between 1200 dpi and 3600 dpi formed by the method of claim 7.

19. A method for using an improved lamination envelope for forming a pre-press proof comprising:
   laminating at least one surface of a lamination envelope with a pre-laminate sheet comprising a thermoplastic layer and a support layer with a release layer and a support base, forming a lamination sandwich;
   removing the support layer forming a pre-lamination envelope;
   laminating a stiffener sheet to said pre-lamination envelope forming an improved lamination envelope;
   creating a pre-laminated receiver stock
   creating an imaged receiver sheet with a second support layer;
   inserting the imaged receiver sheet and a pre-laminated receiver stock into the improved lamination envelope forming a lamination packet;
   laminating the lamination packet forming an imaged lamination sandwich;
   removing the imaged lamination sandwich from the improved lamination envelope; and
   removing said second support layer from the imaged lamination sandwich forming a pre-press proof.

20. The method of claim 19, wherein said stiffener sheet comprises a member of the group, metal, plastic sheets, card stock and combinations thereof.

21. The method of claim 19, wherein said imaged receiver sheet is a pre-press proof.

22. The method of claim 19 wherein said first support layer consists of a support base and a release layer.

23. The method of claim 19 wherein said second support layer consists of a support base, a release layer, and an aluminized layer.

24. The method of claim 19, wherein said thermoplastic layer has a thickness between 1 and 75 microns.

25. The method of claim 19, wherein said imaged receiver sheet comprises a monochrome image.

26. The method of claim 19, wherein said imaged receiver sheet comprises a multi colored image.

27. The method of claim 19, where in the imaged receiver sheet comprises an image is an inkjet generated image.

28. The method of claim 19, wherein said laminating is performed with a belted laminator.

29. A pre-press proof with a resolution of between 1000 dpi and 4000 dpi formed by the method of claim 19.

30. A pre-press proof with a resolution of between 1200 dpi and 3600 dpi formed by the method of claim 19.

* * * * *